United States Patent

Tarsia et al.

Patent Number: 6,064,264
Date of Patent: May 16, 2000

[54] BACKGATE SWITCHED POWER AMPLIFIER

[75] Inventors: Maurice J. Tarsia, Colonia; Hongmo Wang, Watchung, both of N.J.

[73] Assignee: Lucent Technologies Inc., Murray Hill, N.J.

[21] Appl. No.: 09/159,294

[22] Filed: Sep. 23, 1998

[51] Int. Cl.[7] .................................. H03F 3/16; H03F 3/68
[52] U.S. Cl. ............................................. 330/277; 330/295
[58] Field of Search .................................... 330/51, 124 R, 330/134, 277, 285, 295

[56] References Cited

U.S. PATENT DOCUMENTS

| | | | |
|---|---|---|---|
| 4,564,816 | 1/1986 | Kumar et al. .................. | 330/277 X |
| 4,763,081 | 8/1988 | Jason ................................ | 330/149 |
| 4,959,873 | 9/1990 | Flynn et al. .................... | 330/295 X |
| 5,541,554 | 7/1996 | Stengel et al. .................. | 330/51 |

*Primary Examiner*—Steven J. Mottola

[57] ABSTRACT

A switched power amplifier circuit employs non-linear amplifier stages including MOSFET transistors. The transistors each have source, gate, drain and backgate terminals. An input Rf signal is applied to the gate terminals and the source (or drain) terminals are connected to a load. The transistors are operated as switches by selectively applying clock signals to the backgate terminals to activate desired transistors, thus causing the transistors to turn on and allow current to flow through the load to generate power. The power to the load is increased by turning on multiple transistors at any given time.

3 Claims, 1 Drawing Sheet

BACKGATE SWITCHED POWER AMPLIFIER

BACKGROUND OF THE INVENTION

I. Field of the Invention

This invention relates to power amplifiers. More particularly, the present invention is directed to a power amplifier using backgate terminals of non-linear amplifier stages as a substitute for switching transistors.

II. Description of the Related Art

Many modulation methods used in wireless communications employ phase and amplitude variation to increase the spectral efficiency of an RF signal. Known power amplifiers used for modulation in transmitters of communication systems must operate linearly so that phase and amplitude information in a transmitted signal are preserved. One drawback of using linear amplifiers for this purpose lies in the amplifier's low efficiency in converting battery power, used in many communication system applications to power the amplifier, into signal power.

One technique for overcoming the low conversion efficiency of linear amplifiers is to employ an array of switchable high efficiency nonlinear amplifiers as a substitute for a linear amplifier. Such a technique is depicted in the prior art configuration of FIG. 1 and its schematic equivalent shown in FIG. 2. As illustrated in these figures, a plurality of nonlinear amplifier stages $X_1$-$X_n$ (which may be equivalent or may output different power from each other) are connected in parallel and are used to amplify an input Rf signal ($Rf_{in}$) to produce an output Rf signal ($Rf_{out}$). Each amplifier stage is controlled by a separate clock signal ($C_1$-$C_n$).

As shown in FIG. 2, each amplifier stage is implemented using a transistor, such as a MOSFET ($Q_1$, $Q_3$, ... $Q_n$), having a gate (G), a source (S), and a drain (D) terminal. Each such transistor is controlled by a corresponding switch transistor ($Q_2$, $Q_4$ ... $Q_{n+1}$) which, in turn, is activated by a corresponding clock signal $C_1$, $C_3$ ... $C_n$. Thus, when $C_1$ is a certain value (e.g. a logic "1" ), $Q_2$ will turn on and thereby activate $Q_1$, etc., causing a current to flow across a load "L" and generating a power associated therewith. A drawback of the circuit of FIG. 2 is that the switching transistors have significant on-resistance that consumes power and reduces the overall operating efficiency of the amplifier.

SUMMARY OF THE INVENTION

In accordance with the present invention, a switched power amplifier is disclosed wherein an array of switchable nonlinear amplifiers are used to simulate the operation of a linear amplifier. The inventive amplifier employs a plurality of MOSFETs connected in parallel, with each transistor having gate, source, drain and backgate terminals. Rather than employing a switching transistor connected to each amplifier transistor in the array for selectively activating specific amplifier transistors upon application of a clock signal, the backgate terminals of each amplifier transistor are employed for this purpose. Clock signals are applied to the backgate terminals of each amplifier to select desired transistors. Such a configuration overcomes the prior art power consumption inefficiency that is caused by the on-resistance properties of switching transistors and reduces the number of transistors needed to implement the amplifier circuit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE PRESENTLY PREFERRED EMBODIMENTS

Figure 3:
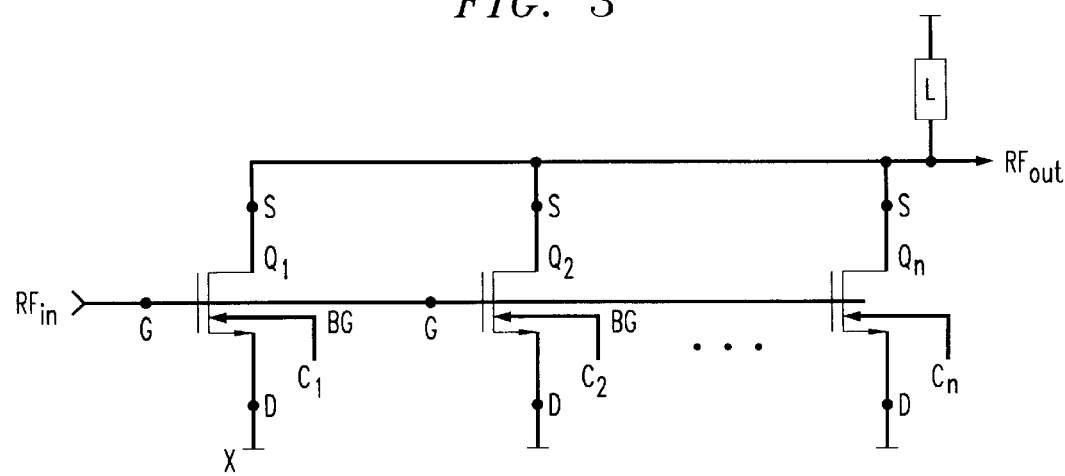
FIG. 3 is a schematic representation of a backgate switched power amplifier in accordance with the present invention.

A schematic representation of a switched power amplifier circuit in accordance with a preferred embodiment of the present invention is shown in FIG. 3. The circuit includes a plurality of non-linear amplifier stages and, in particular, MOSFET transistors $Q_1$-$Q_n$ connected between a load "L" and a common terminal "x", e.g. ground. Each transistor Q has four terminals, namely, a source (S), a gate (G), a drain (D) and a backgate (BG).

It is known that each MOSFET transistor has an inherent impedance value. It is also known that by fixing the backgate terminal (BG) at a potential—such as by tying it to the source terminal (S)—the transistor Q operates in a conventional manner, that is, the output or drain current from the drain terminal (D) is controlled by the voltage applied to the gate terminal (G). In addition, it is widely recognized that the threshold voltage of a MOSFET transistor is a fixed value when the backgate terminal is tied to a fixed voltage but that the threshold voltage can be changed, i.e. raised to prevent turn-on or lowered to facilitate turn-on, by applying an appropriate voltage to the backgate terminal.

Recognizing these properties of a MOSFET transistor, applicant has discovered that applying an appropriate voltage to the backgate terminal of a MOSFET transistor decreases the threshold or turn-on voltage of the transistor, which will facilitate turn-on. Thus, by applying an input signal to the gate terminal while a control signal voltage (e.g. a clock signal) is applied to the backgate terminal, the transistor will be activated. In this manner, the transistor can operate simultaneously as a liner or nonlinear amplifier and a switch.

In the operation of the circuit of FIG. 3, an input Rf signal ($Rf_{in}$) is supplied to the gate terminals of each transistor $Q_1$, $Q_2$ ... $Q_n$ with the source terminals (S) connected to one end of a load "L", having an impedance value, across which an output signal $Rf_{out}$ is produced. Although PMOS transistors are shown in FIG. 3 and are presently preferred, it will be recognized by those having ordinary skill in the art that NMOS transistors can be readily substituted therefor, with appropriate bias voltage changes.

As shown, a clock signal is selectively applied to the backgate terminal of each transistor to selectively activate and turn on the corresponding transistors. For example, clock signal $C_1$ is selectively applied to the backgate (BG) of $Q_1$, clock signal $C_2$ is applied to the backgate terminal of $Q_2$, etc. When this occurs, the selected transistor turns on, thus creating a path for current to flow through the load "L" and generating power associated therewith in the output signal $Rf_{out}$.

Figure 1:
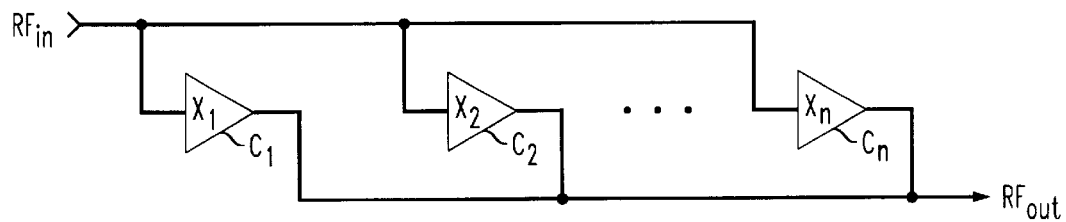
FIG. 1 depicts a prior art switched power amplifier.
Figure 2:
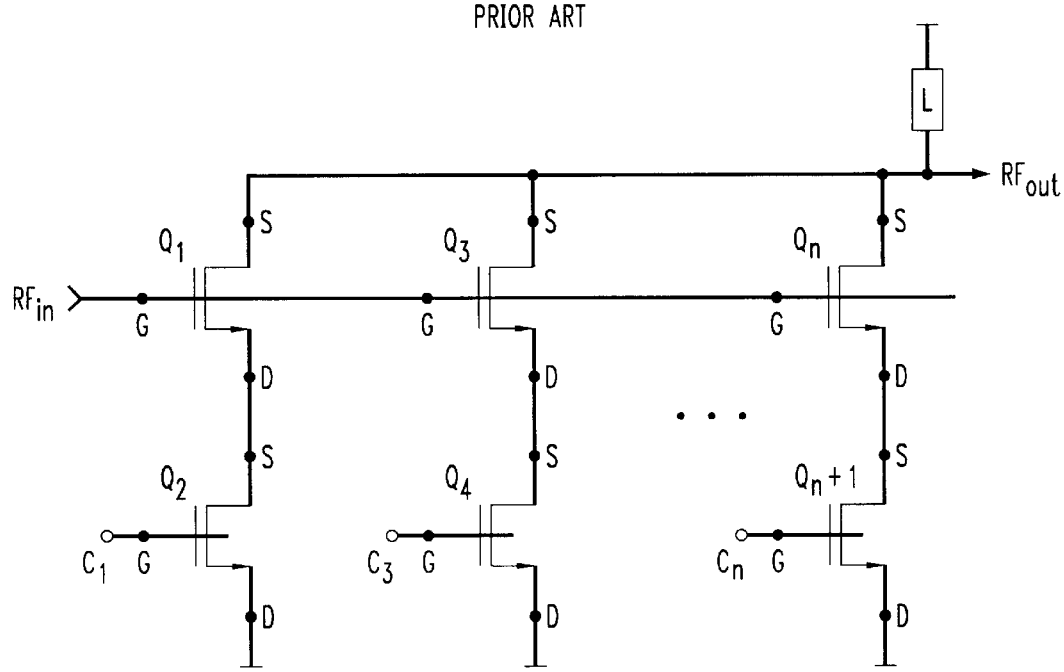
FIG. 2 is a schematic representation of the amplifier arrangement of FIG. 1.

As each transistor Q has an impedance value, the selection of multiple transistors by applying appropriate voltages to the backgate terminals of the corresponding transistors will correspondingly increase the power across the load "L". Thus, the maximum output power generated by the inventive amplifier of FIG. 3 occurs when all of the transistors Q are activated, with proportionally reduced power being produced when fewer transistors are activated. In this manner, the power in $Rf_{out}$ can be selectively controlled and the amplifier circuit can be constructed with fewer transistors than that required by prior art amplifiers such as that depicted in FIG. 2. Moreover, because there is no longer a need for additional switching transistors, the power loss caused by the on-resistance of such transistors in prior art amplifiers is eliminated.

While there have been shown and described and pointed out fundamental novel features of the present invention as applied to a preferred embodiment thereof, it will be understood that various omissions and substitutions and changes in the methods described and in the form and details of the devices illustrated, and in their operation, may be made by those skilled in the art without departing from the spirit of the present invention. For example, although multiple (n) amplifier stages are shown in the schematic diagram of FIG. 3, two or more stages may be employed to yield power amplifiers having lower or otherwise suitable power ratings. It is expressly intended that all combinations of those elements which perform substantially the same function in substantially the same way to achieve the same results are within the scope of the invention. It is the intention, therefore, to be limited only as indicated by the scope of the claims appended hereto.

We claim:

1. A switched power amplifier circuit for amplifying an input signal to generate an output signal having adjustable power, comprising:

a first MOSFET transistor having a gate, a source, a drain and a backgate and configured so that the input signal is applied to the gate, one of said source and drain is connected to a load having an impedance value, the other of said source and drain is connected to a common terminal, and a control signal is selectively applied to said backgate for simultaneously operating said first MOSFET transistor as a switch and for contributing an inherent impedance value of said first MOSFET transistor to the impedance value of the load for amplifying the input signal; and a second MOSFET transistor having a gate, a source, a drain and a backgate, said second MOSFET transistor being configured so that the input signal is applied to its gate, one of its source and drain is connected to said load, the other of its source and drain is connected to said common terminal, and the control signal is selectively applied to its backgate for simultaneously operating said second MOSFET transistor as a switch and for contributing an inherent impedance value of said second MOSFET transistor to the impedance value of the load for amplifying the input signal;

so that when said control signal is applied to one of said first MOSFET transistor backgate terminal and said second MOSFET transistor backgate terminal, the output signal has a first power level, and when said control signal is applied to both of said backgate terminals, the output signal has a second power level higher than said first power level.

2. The circuit of claim 1, wherein said first and second MOSFET transistors comprise PMOS transistors.

3. The circuit of claim 1, further comprising a third MOSFET transistor having a gate, a source, a drain and a backgate, said third MOSFET transistor being configured so that the input signal is applied to its gate, one of its source and drain is connected to said load, the other of its source and drain is connected to said common terminal, and the control signal is selectively applied to its backgate for simultaneously operating said third MOSFET transistor as a switch and for contributing an inherent impedance value of said third MOSFET transistor to the impedance value of the load for amplifying the input signal, so that when said control signal is applied to one of said first MOSFET transistor backgate terminal, said second MOSFET transistor backgate terminal, and said third MOSFET transistor backgate terminal, the output signal has a first power level, and when said control signal is applied to two backgate terminals of said first, second and third MOSFET transistors, the output signal has said second power level higher than said first power level, and when said control signal is applied to the backgate terminals of all of said first, second and third MOSFET transistors, the output signal has a third power level higher than said second power level.

* * * * *